(12) United States Patent
DuBose

(10) Patent No.: US 6,292,501 B1
(45) Date of Patent: Sep. 18, 2001

(54) APPARATUS FOR REDUCING AMPLITUDE MODULATION OF LASER DIODE OUTPUT

(75) Inventor: Harold David DuBose, Mt. View, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/392,830

(22) Filed: Sep. 8, 1999

Related U.S. Application Data

(60) Provisional application No. 60/099,823, filed on Sep. 10, 1998.

(51) Int. Cl.$^7$ ............................. H01S 3/00; H02M 1/12; H01F 17/00; H03B 1/00
(52) U.S. Cl. .................................. 372/38.04; 372/38.02; 363/47; 327/551; 327/554; 323/355
(58) Field of Search ............................. 372/38.02, 38.04, 372/38.07; 363/45, 46, 47, 89; 327/52, 87, 110, 337, 551, 554; 330/107, 109; 323/282, 357, 363

(56) References Cited

U.S. PATENT DOCUMENTS

| | | |
|---|---|---|
| 3,864,624 | 2/1975 | Sugiyama et al. . |
| 4,839,542 | 6/1989 | Robinson . |

FOREIGN PATENT DOCUMENTS

| | | |
|---|---|---|
| 61 044482 | 3/1996 | (JP) . |
| 09 084355 | 3/1997 | (JP) . |
| 11 108963 | 4/1999 | (JP) . |

OTHER PUBLICATIONS

Ajjikuttira, A. et al.: "Intergrated Continuous–Time Filter With Amplitude Detection Tuning" Proceedings of the Midwest Symposium on Circuits and Systems, US. New York, IEEE, vol. SYMP. 32, p. 165–168, XP000139637.

U. Tietze, Ch. Schenk Halbleiter–Schaltungstechnik, Springer–Verlag Berlin 1980, pp. 672–674, XP002127836.

Mohamad Adnan Al–Alaoui: "A Novel Approach To Designing A Noninverting Integrator With Built–In Low Frequency Stability, High Frequency Compensation, And High Q", IEEE Transactions On Instrumentation And Measurement, US, IEEE Inc., New York, vol. 38, No. 6, pas. 1116–1121, XP000095941.

Primary Examiner—Frank G. Font
Assistant Examiner—Armando Rodriguez
(74) Attorney, Agent, or Firm—Stillman & Pollock LLP

(57) ABSTRACT

A laser diode system comprising a voltage source, an inductor connected to the output of the voltage source, an integrator circuit connected in series with the inductor, and a laser diode. The integrator circuit filters out noise from the voltage source, and includes a first resistor, an amplifier, a second resistor, and first and second capacitors. The second capacitor has one lead connected to the input lead of the inductors and the other lead attached to the input of the first resistor. The output lead of the first resistor is connected to the negative input lead of the amplifier, and to the input lead of the first capacitor. The positive input lead of amplifier OP is connected to the output of the inductor (and the anode of the laser diode). The outputs of amplifier and the first capacitor are connected to the input of the second resistor, which has an output connected to the anode of the laser diode. The cathode of laser diode is tied to circuit common. Noise is minimized when the inductance of the inductor is substantially equal to the resistance of the first resistor, times the resistance of the second resistor, times the capacitance of the second capacitor.

28 Claims, 4 Drawing Sheets

US 6,292,501 B1

APPARATUS FOR REDUCING AMPLITUDE MODULATION OF LASER DIODE OUTPUT

This application claims the benefit of U.S. Provisional Application No. 60/099,823, filed Sep. 10, 1998, and entitled Method And Apparatus For Reducing Amplitude Modulation Of Laser Diode Output.

FIELD OF THE INVENTION

The present invention relates to laser diodes, and more particularly to a power supply that generates a drive current for the laser diode having lower amplitude modulation.

BACKGROUND OF THE INVENTION

It has been proposed to use a switching power supply to convert alternating current (AC) wall power to a direct current (DC) drive current for operating DC devices such as laser diodes. The problem with switching power supplies is that they tend to generate drive currents with significant amplitude modulations (current fluctuations) therein. This is a problem for many devices, especially laser diodes, because the drive current amplitude modulations are coupled into the laser diode optical output beam due to the fact that the amplitude of the laser diode output beam is approximately proportional to the laser diode drive current. Many laser diode applications are extremely sensitive to amplitude modulations in the laser diode output beam.

A typical prior art switching power supply is illustrated in FIG. 1, which includes a transformer T, diodes D, inductors L and a capacitor C. The current through the laser diode is represented by $I(t)=I_o+i(t)$, where $i(t)$ is the relatively small alternating component (A.C.) of the current. The A.C. component of the diode current can be decreased by increasing the output of the LC network (i.e. increasing L and C), but this solution has a limited noise reduction effect and is undesirable because it would require increased size and lower bandwidth. Therefore, many power supply manufactures are using linear power supplies for applications sensitive to drive current modulations. These linear power supplies are much larger and more expensive than switching power supplies.

There is a need for a switching power supply that has minimal output current fluctuations, especially for laser diode applications that require minimal optical beam power fluctuations, but without increasing the size or slowing the bandwidth of the switching power supply.

SUMMARY OF THE INVENTION

The present invention solves the aforementioned problems by providing an integrator circuit to the switching power supply circuit to cancel out a significant portion of the AC noise generated by the switching power supply.

In one aspect of the present invention, an integrator circuit, for filtering an electrical signal passing through an inductor having first and second terminals, includes a first resistor, an amplifier, a second resistor and a first capacitor. The first resistor has first and second terminals, where the first terminal is connected to the first terminal of the inductor. The amplifier has first and second input terminals and an output terminal, where the first input terminal is connected to the second terminal of the first resistor, and the second input terminal is connected to the second terminal of the inductor.

The second resistor has a first terminal connected to the output terminal of the amplifier, and a second terminal connected to the second terminal of the inductor. The first capacitor has a first terminal connected to the first input terminal of the amplifier, and a second terminal connected to the output terminal of the amplifier.

In another aspect of the present invention, a power supply includes a voltage source, an inductor with first and second terminals, the first terminal is connected to the voltage source, and an integrator circuit connected in series with the inductor. The integrator circuit includes a first resistor, an amplifier, a second resistor, and a first capacitor. The first resistor has first and second terminals, the first terminal being connected to the first terminal of the inductor. The amplifier has first and second input terminals and an output terminal, where the first input terminal is connected to the second terminal of the first resistor, and the second input terminal is connected to the second terminal of the inductor. The second resistor has a first terminal connected to the output terminal of the amplifier, and a second terminal connected to the second terminal of the inductor. The first capacitor has a first terminal connected to the first input terminal of the amplifier, and a second terminal connected to the output terminal of the amplifier.

In yet another aspect of the present invention, a laser diode system comprises a voltage source, an inductor having first and second terminals, where the first terminal is connected to the voltage source, an integrator circuit connected in series with the inductor, and a laser diode. The integrator circuit includes a first resistor, an amplifier, a second resistor, and a first capacitor. The first resistor has first and second terminals, the first terminal being connected to the first terminal of the inductor. The amplifier has first and second input terminals and an output terminal, where the first input terminal is connected to the second terminal of the first resistor, and the second input terminal is connected to the second terminal of the inductor. The second resistor has a first terminal connected to the output terminal of the amplifier, and a second terminal connected to the second terminal of the inductor. The first capacitor has a first terminal connected to the first input terminal of the amplifier, and a second terminal connected to the output terminal of the amplifier. The laser diode has a first terminal connected to the second terminal of the inductor, and a second terminal connected to the voltage source, for producing an optical output.

In still yet another aspect of the present invention, a power supply for operating an electrical device having an input and an output terminal, includes a voltage source, an inductor having a first terminal connected to the voltage source and a second terminal connected to the input terminal of the electrical device, and an integrator circuit connected in series with the inductor, and a shunt circuit connected between the input and output terminals of the electrical device. The integrator circuit includes a first resistor having first and second terminals, an amplifier having first and second input terminals and an output terminal, and a first capacitor having first and second terminals. The first terminal of the first resistor is connected to the first terminal of the inductor. The first input terminal of the amplifier is connected to the second terminal of the first resistor, and the second input terminal is connected to the second terminal of the inductor. The first terminal of the first capacitor is connected to the first input terminal of the amplifier. The shunt circuit includes a second resistor and a first transistor. The first terminal of the second resistor is connected to the input terminal of the electrical device. The first transistor has a base terminal connected to the output terminal of the amplifier, a collector terminal connected to the second terminal of the second resistor, and an emitter terminal connected to the output terminal of the electrical device.

In still yet one more aspect of the present invention, a power supply for operating an electrical device having an input and an output terminal includes a voltage source for supplying an operating current, an inductor having a first terminal connected to the voltage source and a second terminal connected to the input terminal of the electrical device so that the operating current flows through the electrical device, and an integrator circuit connected in parallel with the inductor for removing amplitude fluctuations from the operating current. The integrator circuit includes a first resistor having first and second terminals, an amplifier having first and second input terminals and an output terminal, a first capacitor having first and second terminals, and one of a second resistor and a shunt circuit. The first terminal of the first resistor is connected to the first terminal of the inductor. The first input terminal of the amplifiers connected to the second terminal of the first resistor, and the second input terminal of the amplifier is connected to the second terminal of the inductor. The first terminal of the capacitor is connected to the first input terminal of the amplifier. The second resistor has a first terminal connected to the output terminal of the amplifier and the second terminal of the first capacitor, and a second terminal connected to the second terminal of the inductor. The shunt circuit includes a third resistor and a first transistor. The third resistor has a first terminal connected to the input terminal of the electrical device and a second terminal connected to the second terminal of the first capacitor. The first transistor has a base terminal connected to the output terminal of the amplifier, a collector terminal connected to the second terminal of the second resistor, and an emitter terminal connected to the output terminal of the electrical device.

Other objects and features of the present invention will become apparent by a review of the specification, claims and appended figures.

DETAILED DESCRIPTION OF THE PREFERRED EMBODIMENTS

The present invention is an improved switching power supply to reduce the alternating component (A.C.) of a laser diode drive current. More specifically, the present invention includes placing an integrator circuit across an inductor portion of a switching power supply to minimize noise fluctuations in the output current of the power supply.

Figure 2:
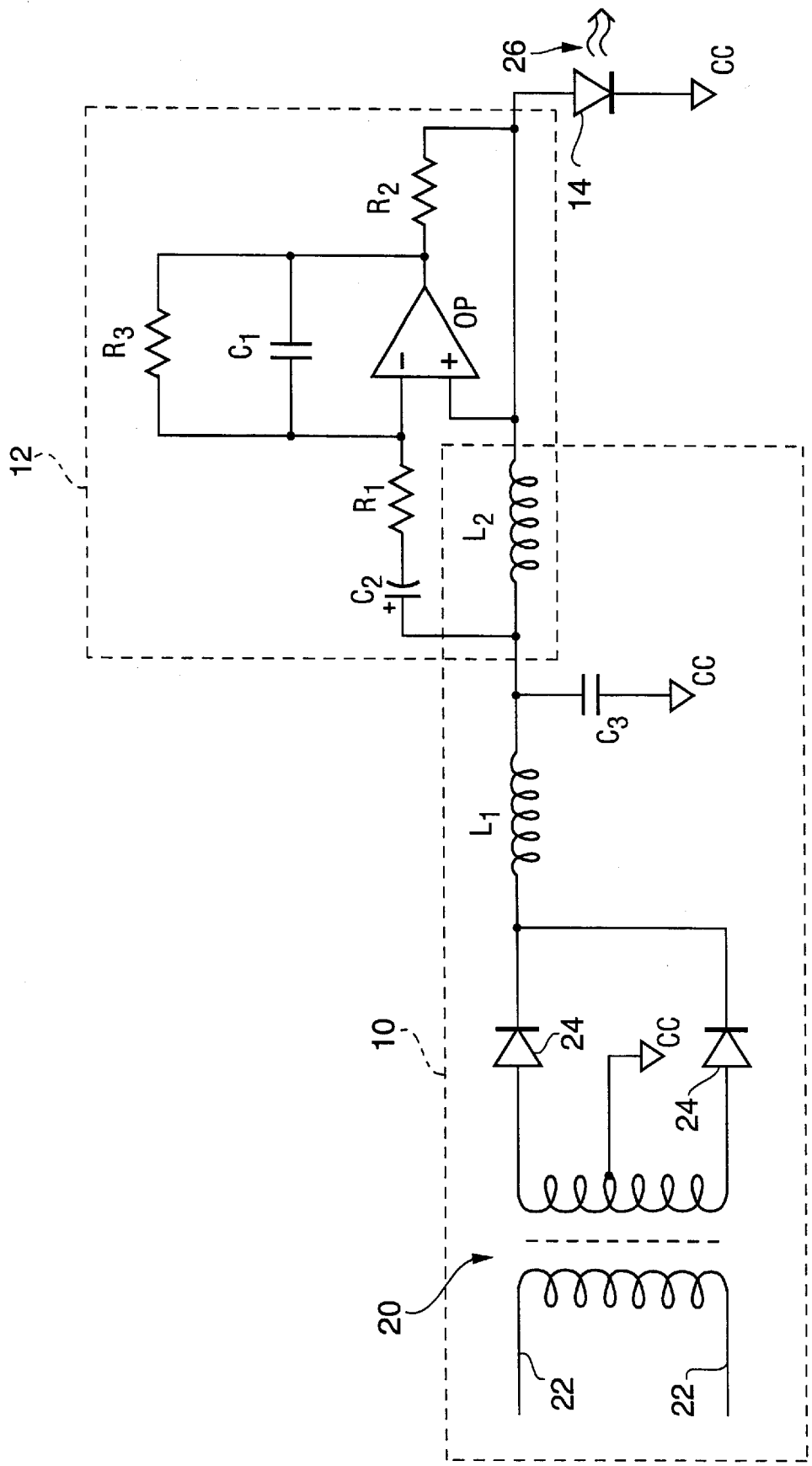
FIG. 2 is a circuit diagram illustrating the integrator circuit and switching power supply of the present invention.

The present invention is illustrated in FIG. 2, and includes the combination of a switching power supply 10 and an integrator circuit 12 to operate a laser diode 14.

The switching power supply 10 includes a transformer 20 with AC input lines 22 and rectifying diodes 24 to rectify the AC input to a DC voltage for supplying a drive current through inductors $L_1$ and $L_2$ (in series) and to laser diode 14 to produce an optical output 26. A capacitor $C_3$ is connected between the inductors $L_1$ and $L_2$ and is tied to the circuit common CC in order to reduce switching noise.

The integrator circuit 12 is placed across one of the inductors of the switching power supply (in this case $L_1$), but could also be placed across an additional inductor added to the switching power supply 10 if desired. The integrator circuit 12 includes a capacitor $C_2$ with one lead connected between the inductors $L_1$ and $L_2$ and the other attached to a resistor $R_1$. Resistor $R_1$ is connected to the negative lead of an amplifier OP, to a capacitor $C_1$ and to a resistor $R_3$. The positive lead of amplifier OP is connected to the output of inductor $L_2$ (and the anode of laser diode 14). The outputs of amplifier OP, capacitor $C_1$ and resistor $R_3$ are connected to a resistor $R_2$, which is connected to the anode of the laser diode 14. The cathode of laser diode 14 is tied to circuit common CC.

Figure 1:
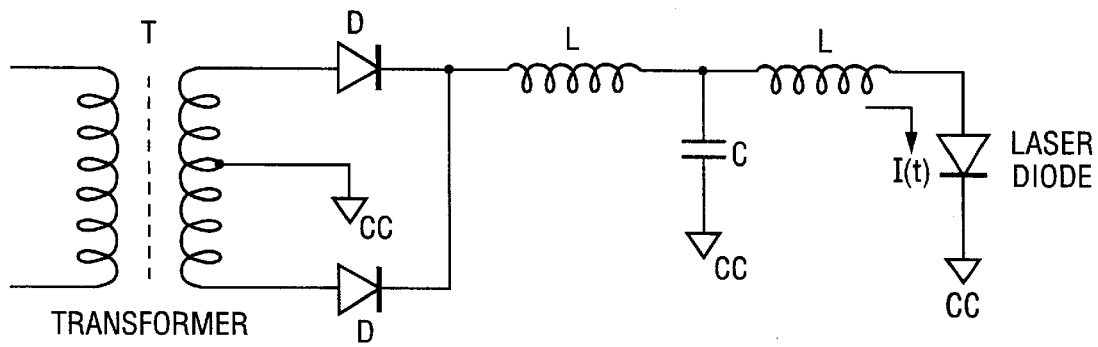
FIG. 1 is a circuit diagram illustrating a switching power supply for operating a laser diode.
Figure 3A:
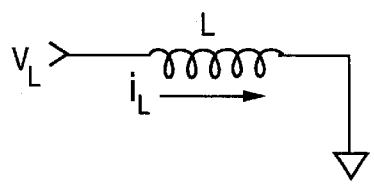
FIG. 3A is a circuit diagram of a simple inductor circuit.

In order to select the proper values of the various electrical components of integrator circuit 12 to minimize (suppress) the current fluctuations generated by the switching power supply, the inductor portion of switching power supply 10 and the integrator circuit 12 need to be considered separately. More specifically, FIG. 3A illustrates a simple inductor circuit with a supplied voltage $V_L$ and inductor L, where the current $i_L$ through the inductor circuit in FIG. 3A is given by:

$$i_L = \frac{1}{L}\int V_L dt \qquad (1)$$

Figure 3B:
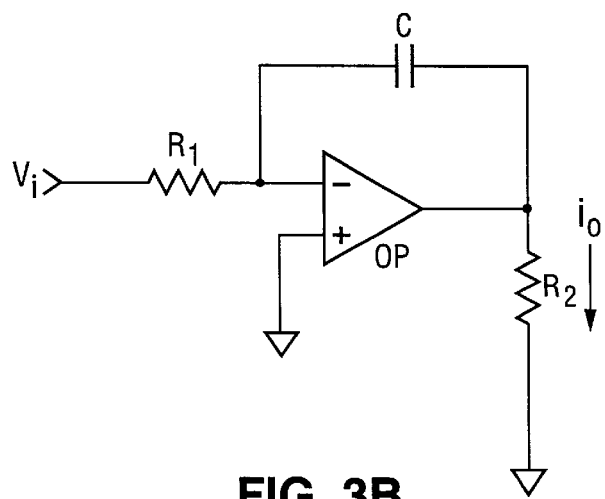
FIG. 3B is a circuit diagram of a simple integrator circuit.

FIG. 3B illustrates an integrator circuit with resistors $R_1$ and $R_2$, capacitor C and amplifier OP, where the current $i_o$ through the integrator circuit in FIG. 3B is given by:

$$i_o = \frac{-1}{R_1 R_2 C}\int V_i dt \qquad (2)$$

Figure 4:
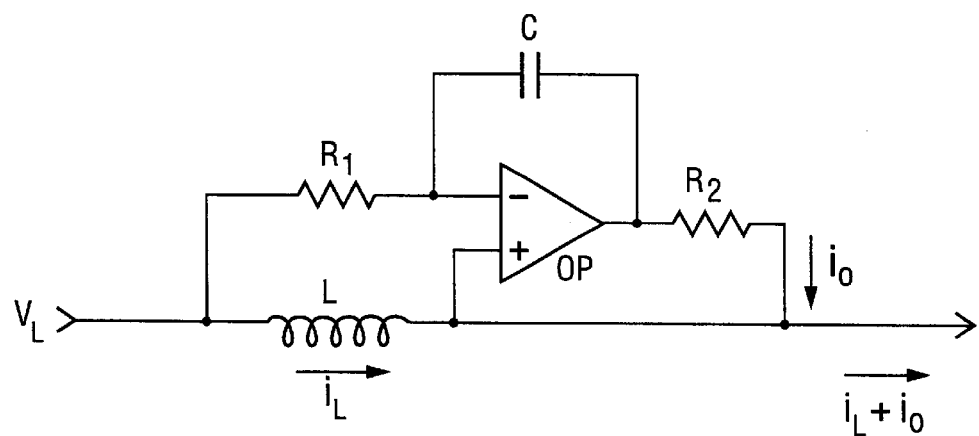
FIG. 4 is a simplified circuit diagram of an integrator circuit applied across an inductor.

Note that equations (1) and (2) have similar form. FIG. 4 illustrates the combination of the circuits of FIGS. 3A and 3B, which produces a total current of $i_L+i_o$. From Equations (1) and (2), we have:

$$i_L + i_o = \frac{1}{L}\int V_L dt - \frac{1}{R_1 R_2 C_1}\int V_i dt \qquad (3)$$

In this case, $V_i=V_L$, so $$i_L + i_o = \frac{1}{L}\int V_L dt - \frac{1}{R_1 R_2 C_1}\int V_L dt, \quad \text{or} \qquad (4)$$

$$i_L + i_o = (1/L - 1/R_1 R_2 C_1)\int V_L dt \qquad (5)$$

In order to minimize the amplitude of current fluctuations, it is desired that $i_L$ and $i_o$ cancel each other out (i.e. $i_L+i_o=0$), which is true when:

$$L=R_1 R_2 C_1 \qquad (6)$$

Therefore, if equation (6) is satisfied in the integrator circuit 12 of FIG. 2, then the AC component of the drive current supplied to the laser diode 14 is minimized.

In practice, the circuit in FIG. 4 should be more complex, as illustrated in FIG. 2. A resistor $R_3$ should be placed across $C_1$ in order to avoid saturation of the amplifier OP. Due to the D.C. current through inductor L, it is also desirable to A.C. couple $V_L$ to $R_1$ with a capacitor $C_2$.

A switching power supply with integration circuit 12 according to FIG. 2 has been developed to minimize diode laser drive current fluctuations. In this embodiment, inductors $L_1$ and $L_2$ are both equal to 4 $\mu$H, $C_1$=0.001 $\mu$F, $C_2$=100 $\mu$F, $C_3$=100 $\mu$F, $R_1$=500 ohms, $R_2$=8 ohms, and $R_3$=$10^6$ ohms (chosen to not disturb or reduce the effectiveness of the noise cancellation effect of integrator circuit 12). Measured noise levels of about 0.1% RMS dropped as much as a factor of 100 when the integrator circuit of the present invention was added to a switching power supply, as described above.

Figure 5:
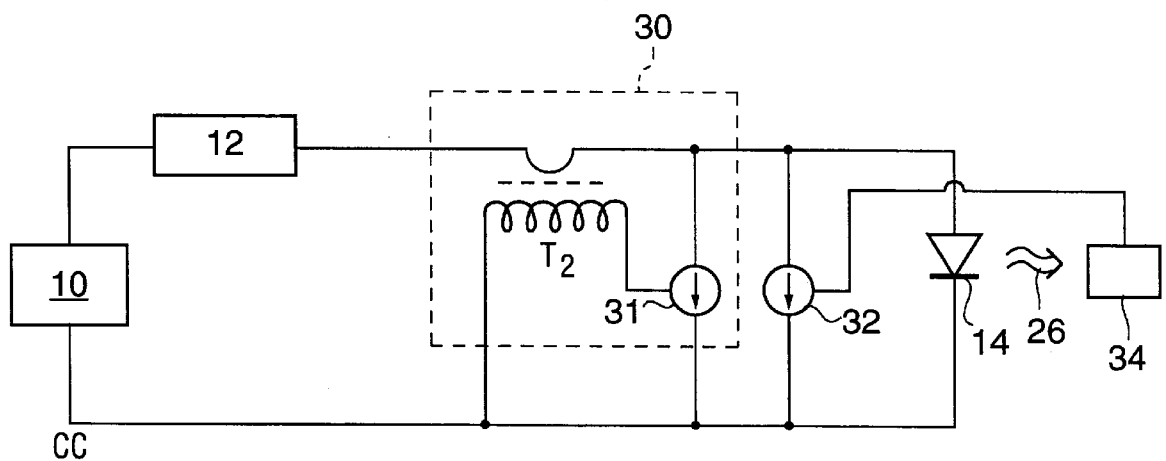
FIG. 5 is a functional circuit diagram illustrating the different noise reduction circuits used with a switching power supply and a laser diode.

To further reduce AC noise, the integrator circuit 12 and capacitor $C_3$ have been combined with two other noise reducing circuits to produce noise levels in the optical output 26 as low as 0.004% RMS, as illustrated in FIG. 5. The first noise reduction circuit 30 includes a current sense transformer $T_2$ and a current shunt amplifier 31. Transformer $T_2$, which in the preferred embodiment is a 50:1 transformer, is used to detect current fluctuations in the diode laser drive current. The current shunt amplifier 31 changes the amount of current shunted to circuit common CC (and away from laser diode 14) in response to, and to compensate for, detected changes in laser diode's drive current. The second noise reduction circuit is a light regulation circuit that includes a current shunt amplifier 32 connected to a detector 34, which measures the amplitude of the optical output 26. The current shunt amplifier 32 changes the amount of current shunted to circuit common CC (and away from laser diode 14) in response to, and to compensate for, detected changes in the power level of optical output 26 in order to minimize output power fluctuations. The different noise reduction circuits illustrated in FIG. 5 are effective for reducing different bandwidths of AC noise. Specifically, the integrator circuit 12 and noise reduction circuit 30 are effective from about 500 Hz to about 300 KHz. The light regulation circuit is effective from DC to about 20 KHz. Capacitor $C_3$ is effective for noise reduction above 10 KHz.

Figure 6:
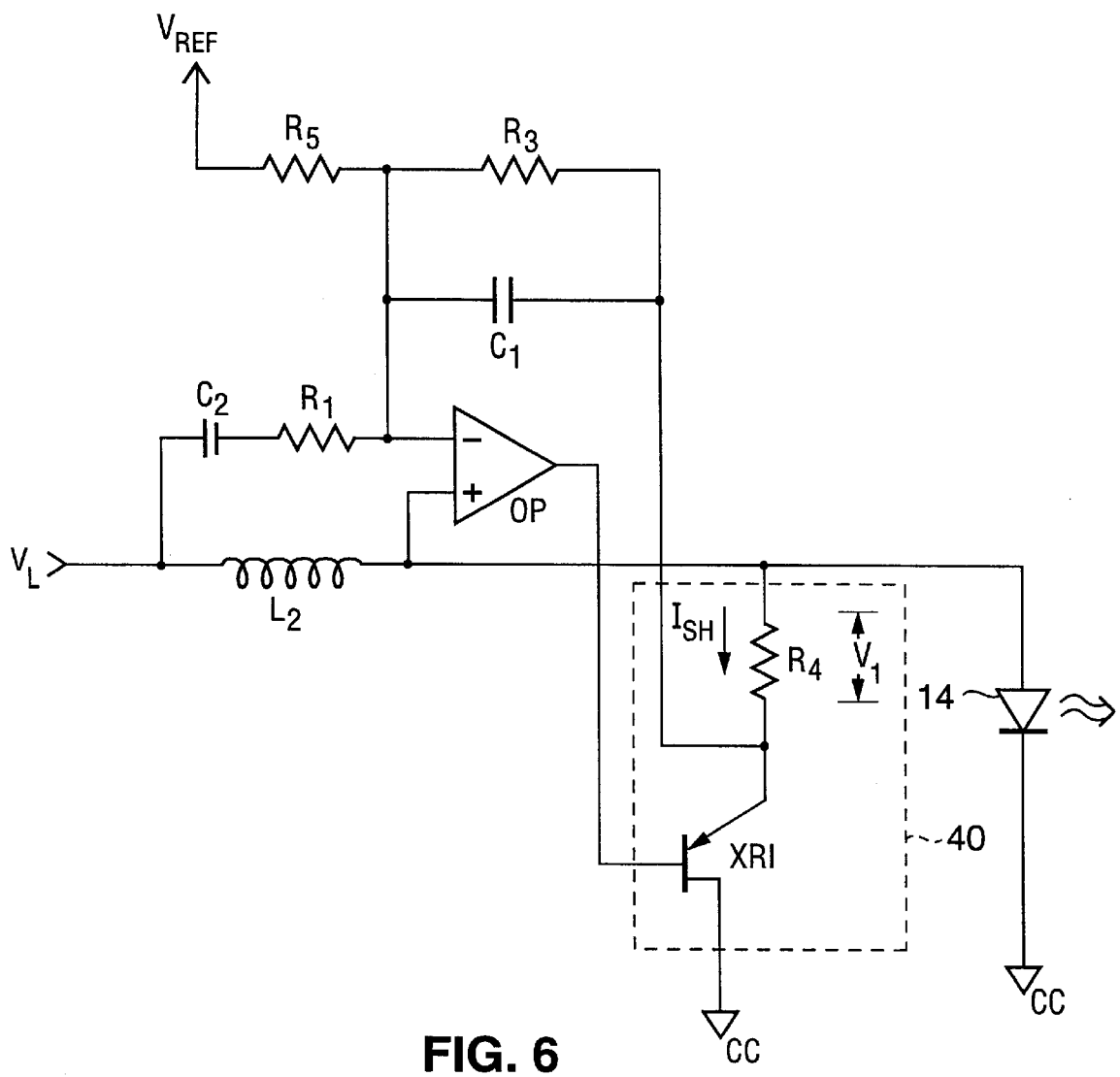
FIG. 6 is a circuit diagram illustrating an alternate embodiment of the present invention.

FIG. 6 illustrates an alternate embodiment of the integrator circuit of the present invention, which is ideal for systems in which the current capabilities of the amplifier are insufficient to properly minimize noise. In this embodiment, a shunt circuit 40 is added that includes a resistor $R_4$ (connected to the output of inductor $L_2$) and a PNP transistor XR1 (collector terminal connected to the output of resistor $R_4$, emitter terminal connected to common ground). A reference voltage source $V_{Ref}$ is connected to the input of resistor $R_3$ via a resistor $R_5$. The output of amplifier OP is connected to the base terminal of transistor XR1, and the output of capacitor $C_1$ and resistor $R_3$ are connected to the shunt circuit between resistor $R_4$ and the collector of transistor XR1.

The transistor XR1 is added as a shunt current amplifying element. Resistor $R_5$ is added to bias XR1 so that a desired amount of average current $I_{SH}$ is shunted through resistor $R_4$ and transistor XR1. The average voltage across resistor $R_4$ is typically about 0.8 volts for low voltage laser diodes (e.g. 1.6 volt diodes). However, this 0.8 volts can vary considerably for other schemes, such as higher voltage diodes, or other noise reducing circuits.

Once the resistance $R_4$ and the desired amount of shunt current $I_{SH}$ is determined, the average voltage $V_1$ across resistor $R_4$ is given by:

$$V_1 = I_{SH} \cdot R_4 \tag{7}$$

The resistance $R_5$ can be determined by:

$$V_1/R_3 = V_{ref}/R_5, \text{ or} \tag{8}$$

$$R_5 = \frac{V_{ref} \cdot R_3}{V_1} \tag{9}$$

where $V_{ref}$ is simply a positive D.C. voltage, such as +5V, +12V, etc.

Figure 7:
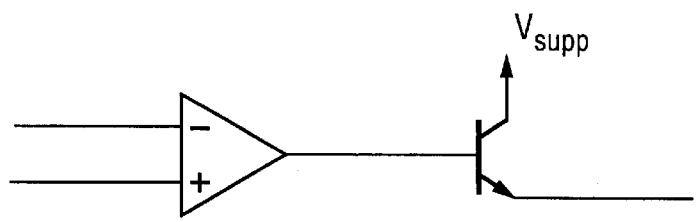
FIG. 7 is a circuit diagram illustrating a buffered amplifier of the present invention.

For applications in which shunt currents might not be suitable, and larger currents than an amplifier can provide are required, the amplifier can by buffered by adding a transistor XR2 to its output, as illustrated in FIG. 7. The base terminal of the transistor XR2 is connected to the output of the amplifier OP. The collector terminal of transistor XR2 is connected to a positive voltage supply $V_{supp}$, and the transistor emitter terminal is connected to resistor $R_2$ (if used in the embodiment shown in FIG. 2) or transistor XR1 (if used in the embodiment shown in FIG. 6).

It is to be understood that the present invention is not limited to the embodiments described above and illustrated herein. For example, the combination of switching power supply and integrator circuits can be used to supply drive current to any electrical device, not just a laser diode, in which a very stable drive current is desired. In addition, the integrating circuit of the present invention can be used to reduce noise from any type of power source, such as a linear power supply, a generator, a battery, etc. In fact, the integrating circuit can be used to filter noise existing in any electrical signal. Moreover, transistor XR1 could be replaced by a P channel FET. Lastly, amplifier OP can be any amplifier with an appropriate current delivery capability, including an operational amplifier, a power operational amplifier, or a high gain voltage amplifier.

What is claimed is:

1. An integrator circuit for filtering an electrical signal passing through an inductor having first and second terminals, the integrator circuit comprising:

a first resistor having first and second terminals, the first terminal is connected to the first terminal of the inductor;

an amplifier having first and second input terminals and an output terminal, the first input terminal is connected to the second terminal of the first resistor, and the second input terminal is connected to the second terminal of the inductor;

a second resistor having a first terminal connected to the output terminal of the amplifier, and a second terminal connected to the second terminal of the inductor; and a first capacitor having a first terminal connected to the first input terminal of the amplifier, and a second terminal connected to the output terminal of the amplifier.

2. The circuit of claim 1, further comprising:

a second capacitor interposed between the first terminal of the first resistor and the first terminal of the inductor.

3. The circuit of claim 2, further comprising:

a third resistor having a first terminal connected to the first input terminal of the amplifier, and a second terminal connected to the output terminal of the amplifier.

4. The circuit of claim 1, wherein:

the first resistor has a resistance of R1;

the second resistor has a resistance of R2;

the first capacitor has a capacitance of C; and the inductor has an inductance L that is substantially equal to R1·R2·C.

5. The circuit of claim 1, further comprising:
a transistor interposed between the amplifier and the second resistor, the transistor having a base terminal connected to the output terminal of the amplifier, an emitter terminal connected to the first terminal of the second resistor, and a collector terminal connected to a positive voltage supply.

6. A power supply, comprising:

a voltage source;

an inductor having first and second terminals, the first terminal is connected to the voltage source; and an integrator circuit connected in parallel with the inductor, the integrator circuit including:
- a first resistor having first and second terminals, the first terminal is connected to the first terminal of the inductor,
- an amplifier having first and second input terminals and an output terminal, the first input terminal is connected to the second terminal of the first resistor, and the second input terminal is connected to the second terminal of the inductor,
- a second resistor having a first terminal connected to the output terminal of the amplifier, and a second terminal connected to the second terminal of the inductor, and
- a first capacitor having a first terminal connected to the first input terminal of the amplifier, and a second terminal connected to the output terminal of the amplifier.

7. The power supply of claim 6, further comprising:
a second capacitor interposed between the first terminal of the first resistor and the first terminal of the inductor.

8. The power supply of claim 7, further comprising:
a third resistor having a first terminal connected to the first input terminal of the amplifier, and a second terminal connected to the output terminal of the amplifier.

9. The power supply of claim 6, wherein:

the first resistor has a resistance of R1;

the second resistor has a resistance of R2;

the first capacitor has a capacitance of C; and the inductor has an inductance L that is substantially equal to R1·R2·C.

10. The power supply of claim 9, wherein the voltage source includes:

a transformer for generating a voltage; and a plurality of rectifier diodes connected between the transformer and the first terminal of the inductor for rectifying the voltage from the transformer.

11. The power supply of claim 6, further comprising:
a transistor interposed between the amplifier and the second resistor, the transistor having a base terminal connected to the output terminal of the amplifier, an emitter terminal connected to the first terminal of the second resistor, and a collector terminal connected to a positive voltage supply.

12. A laser diode system, comprising:

a voltage source;

an inductor having first and second terminals, the first terminal is connected to the voltage source;

an integrator circuit connected in parallel with the inductor, the integrator circuit including:
- a first resistor having first and second terminals, the first terminal is connected to the first terminal of the inductor,
- an amplifier having first and second input terminals and an output terminal, the first input terminal is connected to the second terminal of the first resistor, and the second input terminal is connected to the second terminal of the inductor,
- a second resistor having a first terminal connected to the output terminal of the amplifier, and a second terminal connected to the second terminal of the inductor, and
- a first capacitor having a first terminal connected to the first input terminal of the amplifier, and a second terminal connected to the output terminal of the amplifier; and a laser diode having a first terminal connected to the second terminal of the inductor, and a second terminal connected to the voltage source, for producing an optical output.

13. The laser diode system of claim 12, further comprising:
a second capacitor interposed between the first terminal of the first resistor and the first terminal of the inductor.

14. The laser diode system of claim 13, further comprising:
a third resistor having a first terminal connected to the first input terminal of the amplifier, and a second terminal connected to the output terminal of the amplifier.

15. The laser diode system of claim 12, wherein:

the first resistor has a resistance of R1;

the second resistor has a resistance of R2;

the first capacitor has a capacitance of C; and the inductor has an inductance L that is substantially equal to R1·R2·C.

16. The laser diode system of claim 12, wherein the voltage source includes:

a transformer for generating a voltage; and a plurality of rectifier diodes connected between the transformer and the first terminal of the inductor for rectifying the voltage from the transformer.

17. The laser diode system of claim 12, further comprising:
a current sense transformer for producing an output responsive to an electrical current entering the laser diode;

a shunt amplifier connected between the first and second terminals of the laser diode for shunting current around the laser diode;

wherein the shunt amplifier is responsive to the output from the current sense transformer for shunting fluctuations in the electrical current around the laser diode.

18. The laser diode system of claim 12, further comprising:
a shunt amplifier connected between the first and second terminals of the laser diode for shunting current around the laser diode; and a detector for measuring the optical output from the laser diode and producing an output responsive to the measured optical output;

wherein the shunt amplifier is responsive to the output from the detector for shunting fluctuations in the electrical current around the laser diode.

19. The laser diode system of claim 12, further comprising:
a transistor interposed between the amplifier and the second resistor, the transistor having a base terminal connected to the output terminal of the amplifier, an emitter terminal connected to the first terminal of the second resistor, and a collector terminal connected to a positive voltage supply.

20. A power supply for operating an electrical device having an input and an output terminal, the power supply comprising:

a voltage source;

an inductor having a first terminal connected to the voltage source and a second terminal connected to the input terminal of the electrical device;

an integrator circuit connected in parallel with the inductor, the integrator circuit including:
a first resistor having first and second terminals, the first terminal is connected to the first terminal of the inductor,
an amplifier having first and second input terminals and an output terminal, the first input terminal is connected to the second terminal of the first resistor, and the second input terminal is connected to the second terminal of the inductor, and
a first capacitor having first and second terminals, the first terminal is connected to the first input terminal of the amplifier; and a shunt circuit connected between the input and output terminals of the electrical device, the shunt circuit including:
a second resistor having first and second terminals, the first terminal is connected to the input terminal of the electrical device, and
a first transistor having a base terminal connected to the output terminal of the amplifier, a collector terminal connected to the second terminal of the second resistor, and an emitter terminal connected to the output terminal of the electrical device;

wherein the second terminal of the fist capacitor is connected to the second terminal of the second resistor.

21. The power supply of claim 20, further comprising:

a third resistor having first and second terminals, the second terminal is connected to the first terminal of the first capacitor; and a reference voltage supply connected to the first terminal of the third resistor.

22. The power supply of claim 21, further comprising:

a second capacitor interposed between the first terminal of the first resistor and the first terminal of the inductor.

23. The power supply of claim 22, further comprising:

a fourth resistor having a first terminal connected to the first input terminal of the amplifier, and a second terminal connected to the output terminal of the amplifier.

24. The power supply of claim 23, wherein the voltage source includes:

a transformer for generating a voltage; and a plurality of rectifier diodes connected between the transformer and the first terminal of the inductor for rectifying the voltage from the transformer.

25. The power supply of claim 20, further comprising:

a second transistor interposed between the amplifier and the first transistor, the transistor having a base terminal connected to the output terminal of the amplifier, an emitter terminal connected to the base terminal of the first transistor, and a collector terminal connected to a positive voltage supply.

26. A power supply for operating an electrical device having an input and an output terminal, the power supply comprising:

a voltage source for supplying an operating current;

an inductor having a first terminal connected to the voltage source and a second terminal connected to the input terminal of the electrical device so that the operating current flows through the electrical device; and an integrator circuit connected in parallel with the inductor for removing amplitude fluctuations from the operating current, the integrator circuit including:
a first resistor having first and second terminals, the first terminal is connected to the first terminal of the inductor,
an amplifier having first and second input terminals and an output terminal, the first input terminal is connected to the second terminal of the first resistor, and the second input terminal is connected to the second terminal of the inductor, and
a first capacitor having first and second terminals, the first terminal is connected to the first input terminal of the amplifier; and one of a second resistor and a shunt circuit;

wherein the second resistor has a first terminal connected to the output terminal of the amplifier and the second terminal of the first capacitor, and a second terminal connected to the second terminal of the inductor;

wherein the shunt circuit includes:
a third resistor having a first terminal connected to the input terminal of the electrical device and a second terminal connected to the second terminal of the first capacitor, and
a first transistor having a base terminal connected to the output terminal of the amplifier, a collector terminal connected to the second terminal of the second resistor, and an emitter terminal connected to the output terminal of the electrical device.

27. The power supply of claim 26, further comprising:

a second capacitor interposed between the first terminal of the first resistor and the first terminal of the inductor.

28. The power supply of claim 26, further comprising:

a fourth resistor having a first terminal connected to the first input terminal of the amplifier, and a second terminal connected to the output terminal of the amplifier.

* * * * *